(12) United States Patent
Bagley et al.

(10) Patent No.: US 7,555,966 B2
(45) Date of Patent: Jul. 7, 2009

(54) MICRO MINIATURE AIR GAP INSPECTION CRAWLER

(75) Inventors: Paul C. Bagley, Middleburgh, NY (US); Richard Hatley, Convent Station, NJ (US); Robert M. Roney, Schoharie, NY (US)

(73) Assignee: General Electric Company, Schenectady, NY (US)

( * ) Notice: Subject to any disclaimer, the term of this patent is extended or adjusted under 35 U.S.C. 154(b) by 234 days.

(21) Appl. No.: 11/420,863

(22) Filed: May 30, 2006

(65) Prior Publication Data

US 2007/0277629 A1    Dec. 6, 2007

(51) Int. Cl.
*G01M 19/00* (2006.01)
(52) U.S. Cl. .................................... 73/865.8
(58) Field of Classification Search ............. 73/865.8, 73/622, 623, 618; 324/545, 772; 250/359.1, 250/360.1
See application file for complete search history.

(56) References Cited

U.S. PATENT DOCUMENTS

| | | | |
|---|---|---|---|
| 3,602,036 A | 8/1971 | Peterson | 73/633 |
| 3,930,942 A | 1/1976 | Thome | 376/463 |
| 4,010,636 A | 3/1977 | Clark et al. | 73/637 |
| 4,285,242 A | 8/1981 | Braithwaite | 73/623 |
| 4,285,243 A | 8/1981 | Collingwood | 73/623 |
| 4,581,938 A | 4/1986 | Wentzell | 73/623 |
| 4,585,610 A | 4/1986 | Andersson et al. | 376/249 |
| 4,716,271 A * | 12/1987 | Hulsizer et al. | 219/125.11 |
| 4,803,563 A * | 2/1989 | Dailey et al. | 348/83 |
| 4,876,672 A | 10/1989 | Petermann et al. | 367/35 |
| 4,889,000 A * | 12/1989 | Jaafar et al. | 73/865.8 |
| 5,285,689 A | 2/1994 | Hapstack et al. | 73/623 |
| 5,408,883 A | 4/1995 | Clark et al. | 73/601 |
| 5,557,216 A * | 9/1996 | Dailey et al. | 324/772 |
| 5,563,357 A * | 10/1996 | Longree | 73/866.5 |
| 5,650,579 A | 7/1997 | Hatley et al. | 73/865.8 |
| 5,969,531 A * | 10/1999 | Murakami et al. | 324/545 |
| 6,100,711 A | 8/2000 | Hatley | 324/772 |
| 6,404,189 B2 | 6/2002 | Kwun et al. | 324/220 |
| 6,414,458 B1 | 7/2002 | Hatley et al. | 318/568.12 |
| 6,578,424 B1 | 6/2003 | Ziola et al. | 73/632 |
| 6,658,939 B2 | 12/2003 | Georgeson et al. | |
| 6,672,413 B2 | 1/2004 | Moore et al. | 180/9.21 |
| 6,883,386 B2 | 4/2005 | Osone et al. | 73/861.25 |
| 6,889,783 B1 | 5/2005 | Moore et al. | 180/9.21 |

(Continued)

FOREIGN PATENT DOCUMENTS

JP    61160090 A  *  7/1986

(Continued)

OTHER PUBLICATIONS

Disclosure Statement Under 37 C.F.R. 1.56, filed Apr. 3, 2009.

*Primary Examiner*—Hezron Williams
*Assistant Examiner*—Tamiko D Bellamy
(74) *Attorney, Agent, or Firm*—Sutherland Asbill & Brennan LLP

(57) ABSTRACT

An air gap inspection device. The air gap inspection device may include a substantially rigid rail, a cart positioned on the rail, a drive system for maneuvering the cart along the rail, and an inspection head positioned on the cart.

20 Claims, 3 Drawing Sheets

U.S. PATENT DOCUMENTS

| | | | |
|---|---|---|---|
| 6,959,603 B2 | 11/2005 | Knight et al. | 73/623 |
| 7,077,020 B2 | 7/2006 | Langley et al. | 73/865.8 |
| 7,201,055 B1 | 4/2007 | Bagley et al. | |
| 7,249,512 B2 | 7/2007 | Kennedy et al. | 73/618 |
| 2007/0089544 A1* | 4/2007 | Bagley et al. | 73/865.8 |

FOREIGN PATENT DOCUMENTS

JP   2002209363 A1   7/2002

* cited by examiner

MICRO MINIATURE AIR GAP INSPECTION CRAWLER

TECHNICAL FIELD

The present application relates generally to a miniature robotic device and more particularly relates to a miniature robotic device for performing in-situ inspections of a generator field and stator core.

BACKGROUND OF THE INVENTION

The visual inspection of a generator field and a stator core should be performed on a periodic basis. Conventional generator field/stator core inspection and testing procedures typically require the complete disassembly of the stator and the removal of the generator field before any inspections or tests can be performed on the unit. The costs of the disassembly and removal of the generator field, the time it takes to complete this process, and the dangers inherent in generator field removal have led to the occasional omission of the examination of the generator field and the stator core from routine outage schedules.

In-situ inspections of generators have been performed by employing poles, trolleys, and field turning techniques. These procedures generally have not accomplished the inspection task in a satisfactory manner.

Miniature air gap inspection crawlers ("magic") are disclosed in commonly owned U.S. Pat. Nos. 5,650,579 and 6,100,711, the disclosures of which are hereby incorporated by reference. These crawlers are designed to pass through the radial air gap between the core iron and the retaining ring for an in-situ inspection of the generator field and stator core.

Video cameras and other inspection tools may be attached to the crawler to perform the inspection of the generator field and the stator core. For example, a high resolution video camera may provide a clear view of the stator core laminations, stator wedges, field wedges, and the inboard ends of the retaining rings. The crawler thus provides detection capability for loose stator wedges, vibration bar sparking, core lamination damage due to foreign objects, motoring and hot spots, field wedge arcing, and surface heating damage. Similarly, commonly owned U.S. patent application Ser. Nos. 11/163, 196, 11/306,600, and 11/306,601 describe the ultrasonic inspection of the field and the stator core. These patent applications are incorporated herein by reference. Through the in-situ inspection of the generator, information may be gathered on the overall condition of the generator that can help determine if removal of the field is necessary.

Although these known devices are adequate for in-situ generator inspections, they are largely limited to use with entrance gaps that are greater than about one half inch (about 12.7 millimeters). If the entrance gap is smaller than about one half inch (about 12.7 millimeters), the field generally must be pulled out of the stator for inspection.

Thus, there is a desire for an inspection device that can accommodate entrance gaps of less than about one half inch (about 12.7 millimeters). Preferably, the inspection device can provide visual inspection, ultrasonic inspection, wedge tightness testing, electric core testing, and other types of inspections and testing.

SUMMARY OF THE INVENTION

The present application thus describes an air gap inspection device. The air gap inspection device may include a substantially rigid rail, a cart positioned on the rail, a drive system for maneuvering the cart along the rail, and an inspection head positioned on the cart.

The rail may have a thickness of about 0.2 to about 0.25 inches (about five (5) to about six (6) millimeters) and a width of about one (1) to about three (3) inches (about 25 to about 76 millimeters). The rail may include an end flap thereon. The drive system may include a rail pulley wheel positioned about the rail and a number of cart pulley wheels in communication with the rail pulley wheel. The rail may include a number of legs. The cart may include a base and a mounting arm. The inspection head may include a camera. The cart and the inspection head may include a width of about one (1) to about three (3) inches (about 25 to about 76 millimeters) and a thickness of about 0.2 to about 0.25 inches (about five (5) to about six (6) millimeters).

The present application further may describe a method of inspecting a generator field via an entrance gap with a crawler and an extended rail. The method may include positioning the crawler on the rail, inserting the rail and the crawler through the entrance gap, advancing the crawler along the rail, and inspecting the generator field. The inserting step may include inserting the rail and the crawler through an entrance gap of less than about 0.25 inches (about 6.35 millimeters).

The present application further describes an air gap inspection crawler. The air gap inspection crawler may include a substantially rigid rail, a rail pulley positioned about the rail, a cart positioned on the rail, a number of cart wheels positioned about the cart and in communication with the rail pulley, and an inspection head positioned on the cart.

The rail may have a thickness of about 0.125 to about 0.25 inches (about three (3) to about six (6) millimeters) and a width of about one (1) to about three (3) inches (about 25 to about 76 millimeters). The rail may include a number of legs. The inspection head may include a camera. The cart and the inspection head may include a width of about one (1) to about three (3) inches (about 25 to about 76 millimeters) and a thickness of about 0.2 to about 0.25 inches (about five (5) to about six (6) millimeters).

These and other features of the present application will become apparent to one of ordinary skill in the art upon review of the following detailed description when taken in conjunction with the drawings and the appended claims.

DETAILED DESCRIPTION

Figure 1:
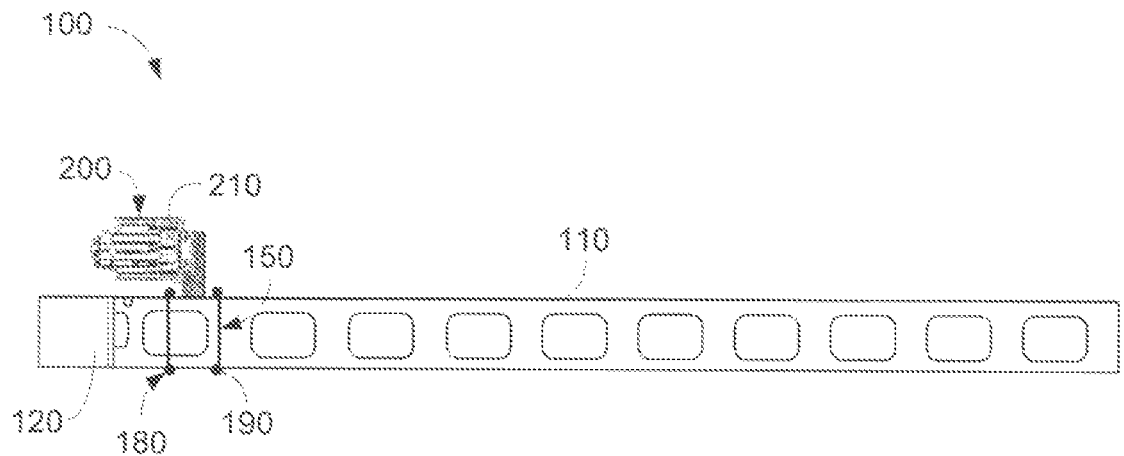
FIG. 1 is a top plan view of a micro miniature air gap inspection crawler as is described herein.
Figure 2:
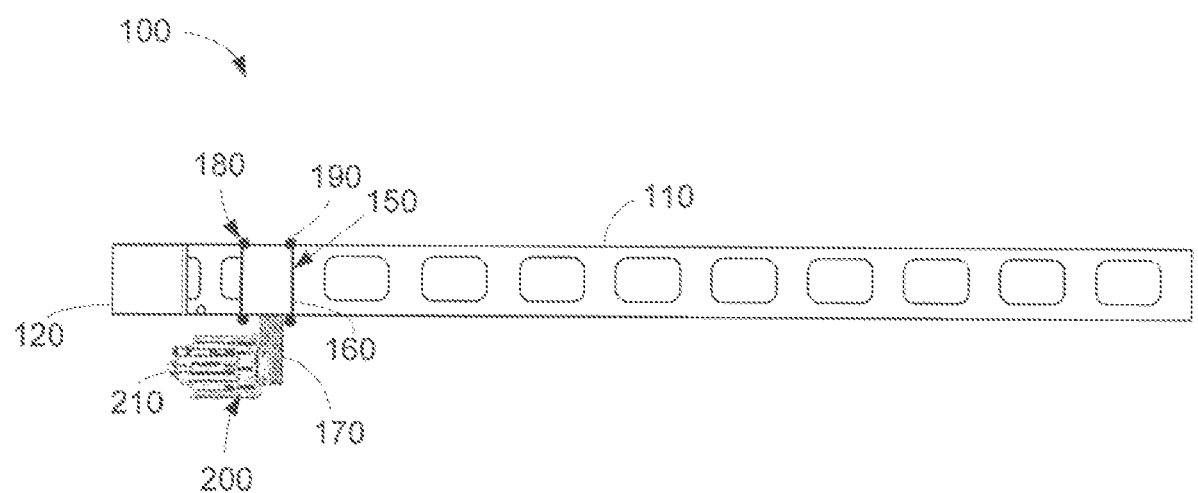
FIG. 2 is a bottom plan view of the micro miniature air gap inspection crawler of FIG. 1.
Figure 3:
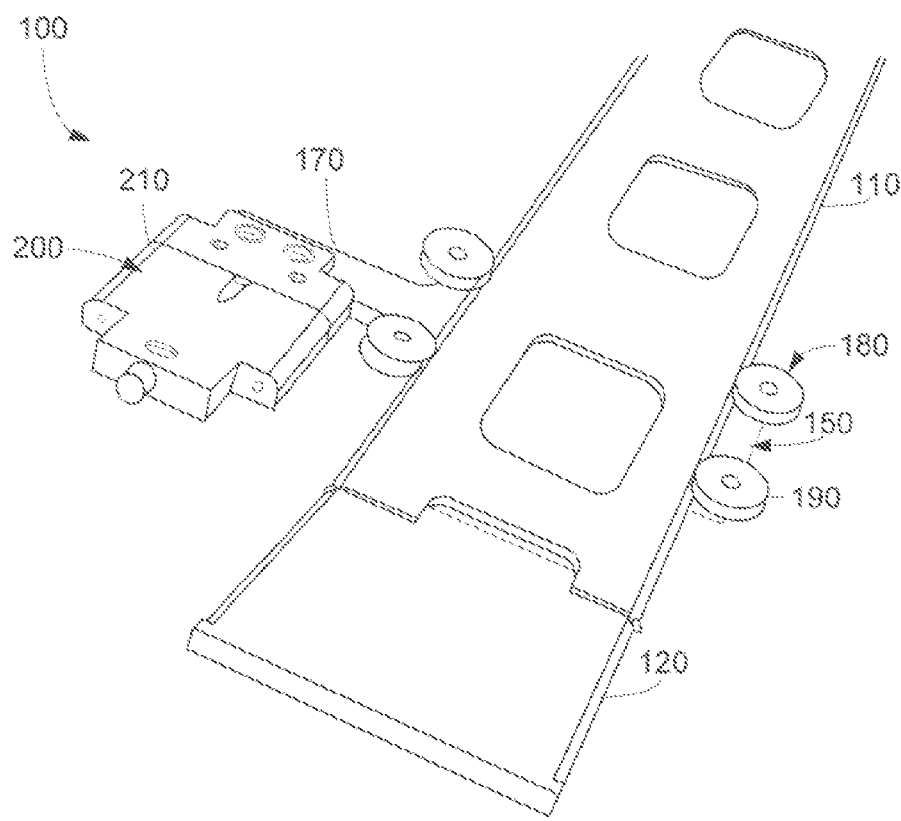
FIG. 3 is a top perspective view of the micro miniature air gap inspection crawler of FIG. 1.
Figure 4:
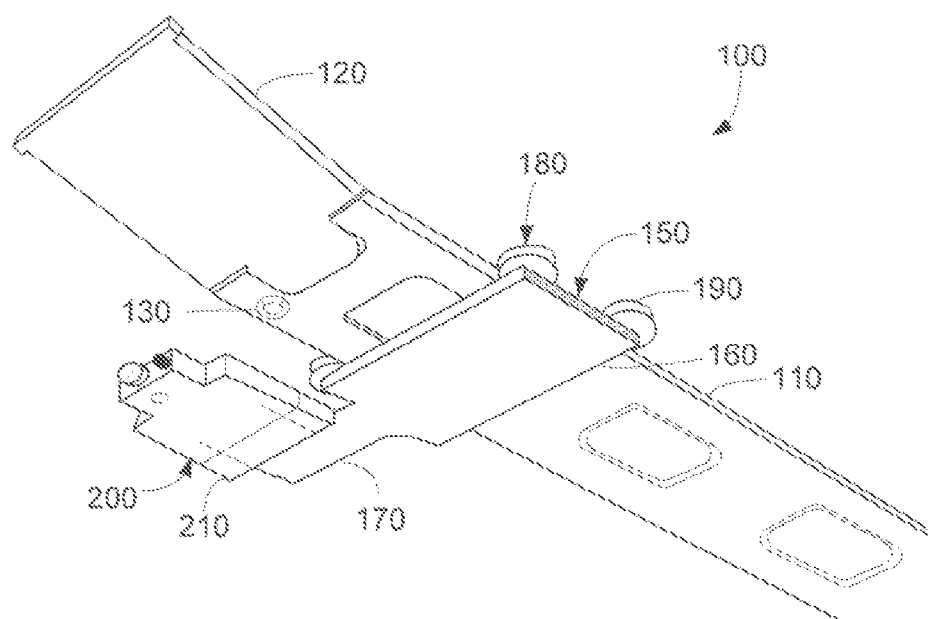
FIG. 4 is a bottom perspective view of the micro miniature air gap inspection crawler of FIG. 1.

Referring now to the drawings, in which like numerals refer to like elements throughout the several view, FIGS. 1-4 show a micro miniature air gap inspection crawler 100 as is described herein. The micro miniature air gap inspection crawler 100 includes an extended rail 110. The rail 110 may be made out of aluminum, carbon fiber composite, or similar types of substantially rigid materials. By way of example, the rail 110 may have a thickness of about 0.125 to about 0.25 inches (about three (3) to about six (6) millimeters) and a width of about one (1) to about three (3) inches (about 25 to about 76 millimeters). Although the rail 110 is shown as rectangular, any desired shape may be used. The rail 110 also may have any desired length. The rail 110 may come in sections, with additional sections being added or removed so as to provide the appropriate length. The length of the rail 110 may match that of the field or stator. In this example, the rail may have a length of about five (5) to about fifteen (15) feet (about 1.5 to about five (5) meters).

Figure 5:
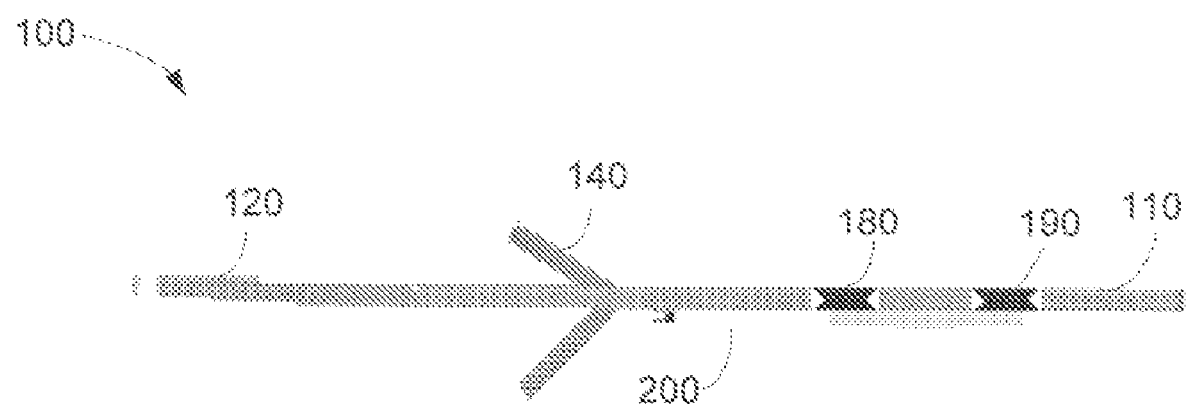
FIG. 5 is a side plan view of the micro miniature air gap inspection crawler of FIG. 1 with the legs extended.

The rail 110 may have an end flap 120 on one end thereof. The end flap 120 may be hinged so as to position the rail 110 within the entrance gap and to position the cart thereon as will be described in more detail below. The rail 110 may be substantially hollow. The rail 110 may have a rail pulley wheel 130 positioned therein. The rail pulley wheel 130 is part of a drive system as will be described in more detail below. Likewise, the rail pulley wheel 130 and the drive system may be driven externally as will be described in more detail below. The rail 110 also may have a number of legs 140 positioned therein. As is shown in FIG. 5, the legs 140 may be hinged so as to expand when desired. A pneumatic cylinder or any similar type of drive device may drive the legs 140 as desired. The legs 140 may support the rail 110 between the field and the stator.

Positioned on the rail 110 may be a cart 150. The cart 150 may include a base 160 and a mounting arm 170. The base 160 may be made out of aluminum, carbon fiber or similar types of substantially rigid materials. The base 160 may extend across the width of the rail 110 on one side thereof. The mounting arm 170 may extend about one side of the base 160 and the rail 110. The mounting arm 170 may extend for about one (1) to about three (3) inches (about 25 to about 76 millimeters). The base 160 and the mounting arm 170 may be a single element or a multiple element part.

The cart 150 further may include part of a drive system 180 positioned therein. The drive system 180 includes a number of cart pulley wheels 190. The cart pulley wheels 190 ride along the edges of the rail 110 so as to maneuver the cart 150 along the length of the rail 110. A dovetail slide may be used instead of a wheel. The drive system 180 may be in communication with the rail pulley wheel 130 of the rail 110 via a pulley wire (not shown) or other type of drive means. The drive system 180 with the rail pulley wheel 130 and the cart pulley wheels 190 may be driven by an external source such as electric motor, air piston, or similar types of drive devices. A push rod also may be used herein.

Positioned on the mounting arm 170 of the base 160 may be an inspection head 200. In this example, the inspection head 200 schematically includes a camera 210 for illustration purposes. The camera 210, generally described, may include a forward view camera of fixed focus used for navigation and detection and a variable view camera with a power focus assembly and a right angle prism to allow for viewing of the stator and field surfaces. Any desired type of camera may be used herein.

Alternatively or in addition to, the inspection head 200 also may include an ultrasonic transducer of conventional design. The transducer may detect cracks as small as about 0.025 inches (about 0.635 millimeters). The inspection head 200 also may include means for spreading couplant before the transducer. (Couplant is a material (usually liquid) that facilitates the transmission of ultrasonic energy from the transducer into the test specimen.) The inspection head 200 also may include a wedge tightness module to perform a wedge tapping test. Likewise, the inspection head 200 also may carry an ELCID coil (Electromagnetic Core Imperfection Detector) for inspecting shorted stator punchings. Any other type of inspection device may be used herein, alone or in combination.

The cart 150 and the inspection head 200 may have a width of about two (2) to about six (6) inches (about 50 to about 150 millimeters) and a thickness of about 0.2 to about 0.25 inches (about five (5) to about six (6) millimeters). These dimensions may vary as desired based upon the nature of the inspection device.

In use, the desired inspection head 200 may be positioned on the mounting arm 170 of the cart 150. The cart 150 in turn may be positioned on the end flap 120 of the rail 110. The rail 110 then may be positioned within the air gap. The drive system 180 then may be engaged so as to maneuver the cart 150 along the length of the rail 110. The cart 150 thus progresses down the rail along the length of the generator field and stator core with the inspection head 200 performing the desired inspections. Once the cart 150 completes the length of the rail 110, the rail 110 may be rotated and the micro miniature air gap inspection crawler 100 may take another pass.

The micro miniature air gap inspection crawler 100 may be used with a tractor section so as to move the micro miniature air gap inspection crawler 100 circumferentially about the field. The tractor section may be similar to that described in commonly owned U.S. Pat. No. 6,100,711, described above. The rail 110 may be attached to the tractor section for maneuvering therewith. Any desired type of drive means may be used herein. Likewise, the external drive for the drive system 180 may be mounted onto the tractor section for maneuvering therewith.

It should be apparent that the foregoing relates only to the preferred embodiments of the present application and that numerous changes and modifications may be made herein by one of ordinary skill in the art without departing from the general spirit and scope of the invention as defined by the following claims and the equivalents thereof.

We claim:

1. An air gap inspection device for inspecting an air gap between a rotor and a stator, the device comprising:
    a substantially rigid rail that is sized and shaped to be positioned in the air gap;
    a cart positioned on the rail;
    a drive system for maneuvering the cart along the rail; and
    an inspection head associated with the cart laterally adjacent to the rail.

2. The air gap inspection device of claim 1, wherein the rail may have a thickness of about 0.2 to about 0.25 inches and a width of about one to about three inches.

3. The miniature air gap inspection crawler of claim 1, wherein the rail comprises an end flap thereon.

4. The air gap inspection device of claim 1, wherein the drive system comprises a rail pulley wheel positioned about the rail.

5. The air gap inspection device of claim 4, wherein the drive system comprises a plurality of cart pulley wheels in communication with the rail pulley wheel.

6. The air gap inspection device of claim 1, wherein the rail comprises a plurality of legs.

7. The air gap inspection device of claim 1, wherein the cart comprises a base and a mounting arm, the mounting arm extending laterally from the cart to associate the cart with the inspection head.

8. The air gap inspection device of claim 1, wherein the inspection head comprises a camera.

9. The air gap inspection device of claim 1, wherein the cart and the inspection head comprise a width of about one to about three inches and a thickness of about 0.2 to about 0.25 inches.

10. A method of inspecting a generator field via an entrance gap between a rotor and a stator, the generator field being inspected with a crawler on an extended rail, the method comprising:

positioning the crawler on the rail, the crawler having an inspection head located laterally adjacent to the rail;

inserting the rail and the crawler through the entrance gap;

advancing the crawler along the rail; and inspecting the generator field with the inspection head.

11. The method of claim 10, wherein the inserting step comprises inserting the rail and the crawler through an entrance gap of less than about 0.25 inches.

12. The method of claim 10, wherein the entrance gaps is less than about 0.25 inches and wherein the method further comprises sizing the rail and the crawler to fit through the entrance gap.

13. An air gap inspection crawler, comprising:

a substantially rigid rail;

a rail pulley positioned about the rail;

a cart positioned on the rail;

a plurality of cart wheels positioned about the cart and in communication with the rail pulley; and an inspection head associated with the cart laterally adjacent to the rail.

14. The air gap inspection crawler of claim 13, wherein the rail may have a thickness of about 0.125 to about 0.25 inches and a width of about one to about three inches.

15. The air gap inspection crawler of claim 13, wherein the rail comprises a plurality of legs.

16. The air gap inspection crawler of claim 13, wherein the inspection head comprises a camera.

17. The air gap inspection crawler of claim 13, wherein the cart and the inspection head comprise a width of about one to about three inches and a thickness of about 0.2 to about 0.25 inches.

18. The air gap inspection device of claim 1, wherein the rail is substantially linear in shape.

19. The air gap inspection crawler of claim 13, wherein the rail is substantially linear in shape.

20. The air gap inspection crawler of claim 13, wherein cart comprises a base and a mounting arm, the mounting arm extending laterally from the cart to associate the cart with the inspection head.

* * * * *